(12) United States Patent
Kamada et al.

(10) Patent No.: US 10,935,566 B2
(45) Date of Patent: Mar. 2, 2021

(54) ACCELERATION SENSOR

(71) Applicant: HITACHI, LTD., Tokyo (JP)

(72) Inventors: Yuudai Kamada, Tokyo (JP); Atsushi Isobe, Tokyo (JP); Noriyuki Sakuma, Tokyo (JP); Chisaki Takubo, Tokyo (JP); Tomonori Sekiguchi, Tokyo (JP)

(73) Assignee: HITACHI, LTD., Tokyo (JP)

( * ) Notice: Subject to any disclaimer, the term of this patent is extended or adjusted under 35 U.S.C. 154(b) by 403 days.

(21) Appl. No.: 15/671,340

(22) Filed: Aug. 8, 2017

(65) Prior Publication Data
US 2018/0252744 A1    Sep. 6, 2018

(30) Foreign Application Priority Data

Mar. 3, 2017    (JP) .............................. JP2017-040290

(51) Int. Cl.
*G01P 15/08*    (2006.01)
*G01P 15/125*    (2006.01)
(Continued)

(52) U.S. Cl.
CPC .......... *G01P 15/125* (2013.01); *B81B 3/0051* (2013.01); *G01P 15/0802* (2013.01);
(Continued)

(58) Field of Classification Search
CPC ..... G01P 2015/0871; G01P 2015/0831; G01P 2015/0874
See application file for complete search history.

(56) References Cited

U.S. PATENT DOCUMENTS 5,488,862 A * 2/1996 Neukermans ...... G01C 19/5719
73/504.02
5,610,335 A * 3/1997 Shaw .................... B81B 3/0051
73/514.36
(Continued)

FOREIGN PATENT DOCUMENTS

JP    4636220 B2    2/2011
JP    2011-148084 A    8/2011
(Continued)

OTHER PUBLICATIONS

Office Action dated Feb. 25, 2020 in corresponding Japanese Application 2017-040290.
(Continued)

*Primary Examiner* — Alexander A Mercado
(74) *Attorney, Agent, or Firm* — Miles & Stockbridge, P.C.

(57) ABSTRACT

Provided is an acceleration sensor having a large mass in a movable portion, and realizing high impact resistance. An acceleration sensor element 10a includes an upper substrate 20, a lower substrate 21 spaced apart from the upper substrate 20, and an intermediate substrate 19 provided between the upper substrate 20 and the lower substrate 21. Each of a first movable portion 16, a second movable portion 17, a frame portion 12, a fixed portion 13, and a spring portion 14 constituting the intermediate substrate 19 is configured with two layers of an upper layer and a lower layer, and a stopper portion 18 is provided at one end of the frame portion 12. A distance 31 between an end portion of the first movable portion 16 or the second movable portion 17 and an end portion of the stopper portion 18 in the upper layer and a distance 32 between an end portion of the first movable portion 16 or the second movable portion 17 and an
(Continued)

end portion of the stopper portion 18 in the lower layer are different from each other.

13 Claims, 14 Drawing Sheets

(51) Int. Cl.
    *B81B 3/00*           (2006.01)
    *G01P 15/18*         (2013.01)
    *H01H 1/00*          (2006.01)
    *H01H 36/00*        (2006.01)

(52) U.S. Cl.
    CPC ........... *G01P 15/18* (2013.01); *H01H 1/0036* (2013.01); *H01H 36/0006* (2013.01); *B81B 2201/0235* (2013.01); *G01P 2015/0871* (2013.01)

(56) References Cited

U.S. PATENT DOCUMENTS

| | | | |
|---|---|---|---|
| 7,225,675 B2* | 6/2007 | Kato | G01C 19/5719 73/514.32 |
| 7,690,255 B2 | 4/2010 | Gogoi | |
| 9,061,895 B2 | 6/2015 | Robert et al. | |
| 9,958,472 B2 | 5/2018 | Kamada et al. | |
| 10,287,159 B2 | 5/2019 | Matsuoka et al. | |
| 2002/0000363 A1* | 1/2002 | Itoigawa | H01H 35/14 200/61.49 |
| 2003/0136654 A1* | 7/2003 | Itoigawa | G01P 15/135 200/61.48 |
| 2007/0029629 A1 | 2/2007 | Yazdi | |
| 2009/0031809 A1* | 2/2009 | Lin | G01P 15/125 73/514.32 |
| 2009/0266164 A1* | 10/2009 | Furukubo | G01P 1/023 73/514.32 |
| 2009/0320596 A1 | 12/2009 | Classen et al. | |
| 2012/0031186 A1* | 2/2012 | Classen | B81B 3/0045 73/514.32 |
| 2013/0111992 A1* | 5/2013 | O'Brien | G01P 15/125 73/504.12 |
| 2013/0192364 A1 | 8/2013 | Acar | |
| 2013/0269434 A1* | 10/2013 | Kamisuki | G01P 15/125 73/514.32 |
| 2014/0007685 A1* | 1/2014 | Zhang | G01P 15/125 73/514.32 |
| 2014/0230551 A1* | 8/2014 | Kunimi | G01P 15/0802 73/514.32 |
| 2014/0260613 A1* | 9/2014 | Qiu | G01C 19/5733 73/504.15 |
| 2014/0338451 A1* | 11/2014 | Takagi | G01P 15/125 73/514.32 |
| 2015/0013458 A1* | 1/2015 | Tanaka | B81B 3/0051 73/514.35 |
| 2015/0177272 A1* | 6/2015 | Clark | G01P 15/097 850/5 |
| 2015/0198626 A1* | 7/2015 | Kim | G01P 15/123 73/514.33 |
| 2015/0239731 A1* | 8/2015 | Ahtee | B81B 3/0051 257/415 |
| 2017/0073214 A1* | 3/2017 | Matsuoka | B81B 3/00 |
| 2017/0219620 A1* | 8/2017 | Jeong | B81B 3/00 |
| 2018/0238926 A1* | 8/2018 | Shiota | B81C 1/00198 |
| 2018/0252744 A1* | 9/2018 | Kamada | G01P 15/125 |
| 2019/0094262 A1* | 3/2019 | Ito | G01P 15/0802 |
| 2019/0107397 A1* | 4/2019 | Ito | G01P 15/125 |
| 2019/0120872 A1* | 4/2019 | Geisberger | G01P 15/125 |

FOREIGN PATENT DOCUMENTS

| | | |
|---|---|---|
| JP | 2013076610 A | 4/2013 |
| JP | 2014102172 A | 6/2014 |
| JP | 201670817 A | 5/2016 |
| WO | 2015186728 A1 | 12/2015 |

OTHER PUBLICATIONS

Final Office Action dated Sep. 27, 2017 issued in corresponding U.S. Appl. No. 14/822,419.
Non Final Office Action dated Jul. 3, 2017 issued in corresponding U.S. Appl. No. 14/822,419.
Notice of Allowance dated Feb. 15, 2018 issued in corresponding U.S. Appl. No. 14/822,419.

* cited by examiner

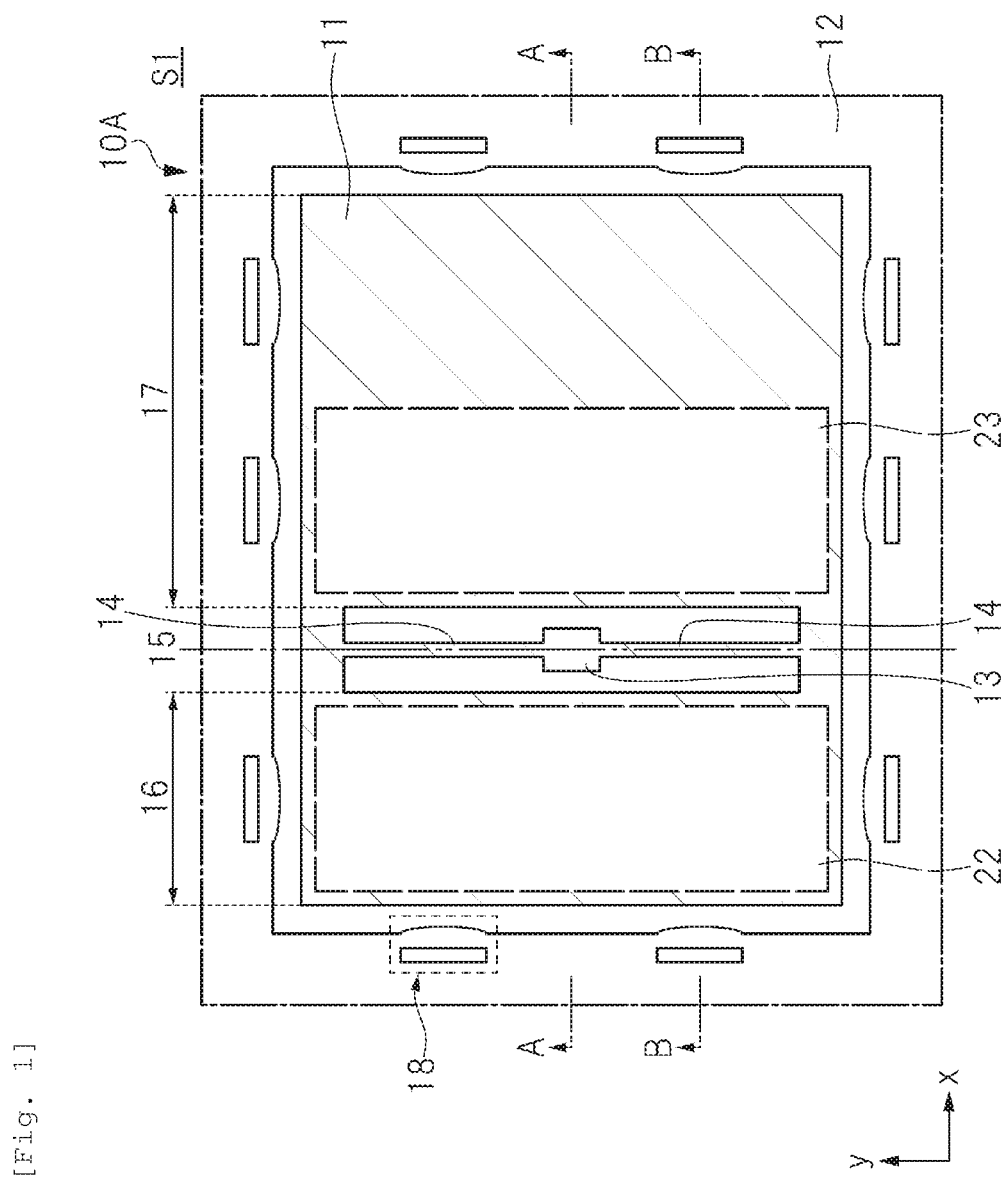
[Fig. 1]

[FIG. 2] (a)
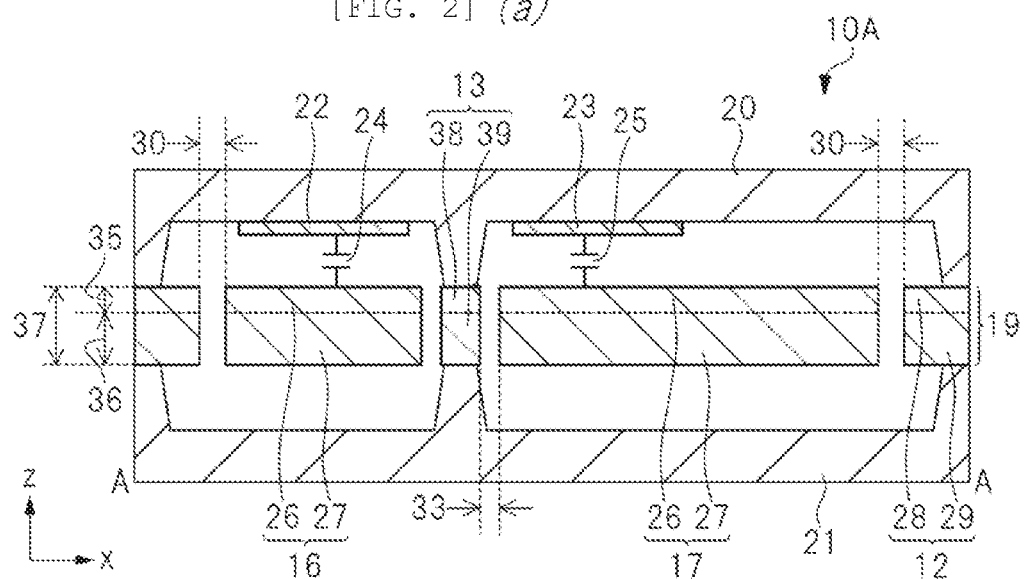
[FIG. 2] (b)
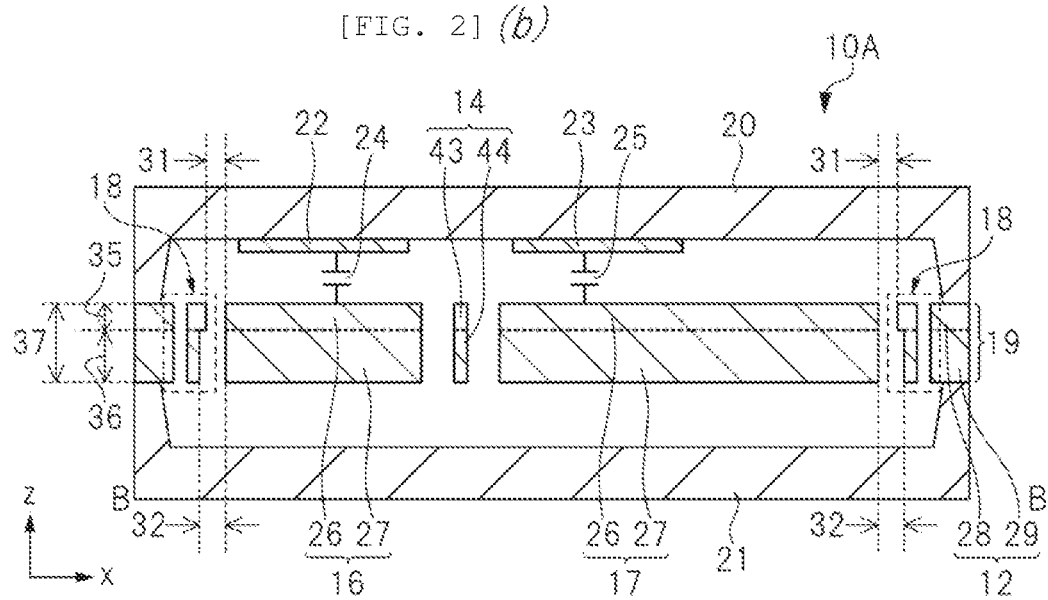
10A : ACCELERATION SENSOR ELEMENT  17 : SECOND MOVABLE PORTION
12 : FRAME PORTION                 18 : STOPPER PORTION
13 : FIXED PORTION                 19 : INTERMEDIATE SUBSTRATE
14 : SPRING PORTION                20 : UPPER SUBSTRATE
16 : FIRST MOVABLE PORTION         21 : LOWER SUBSTRATE

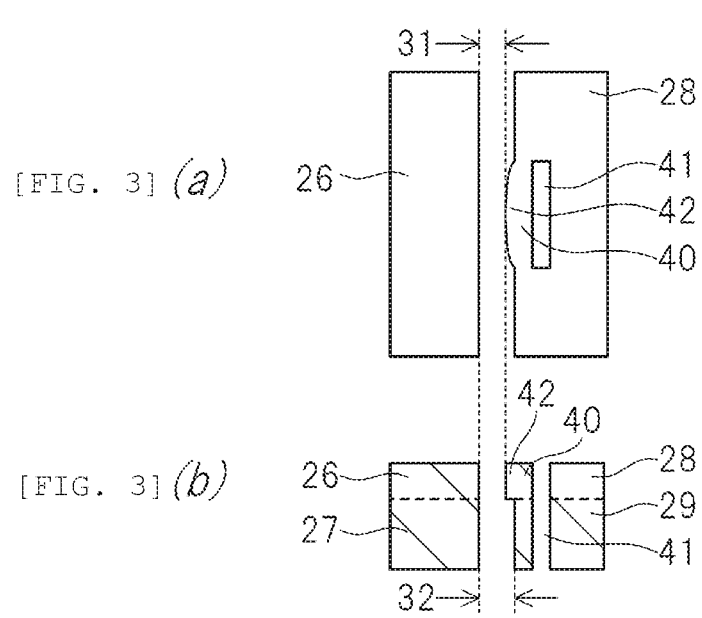
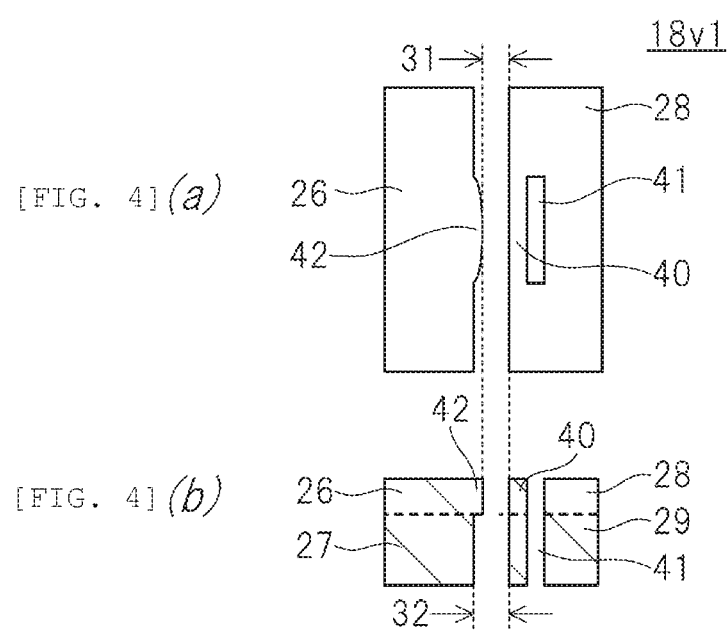

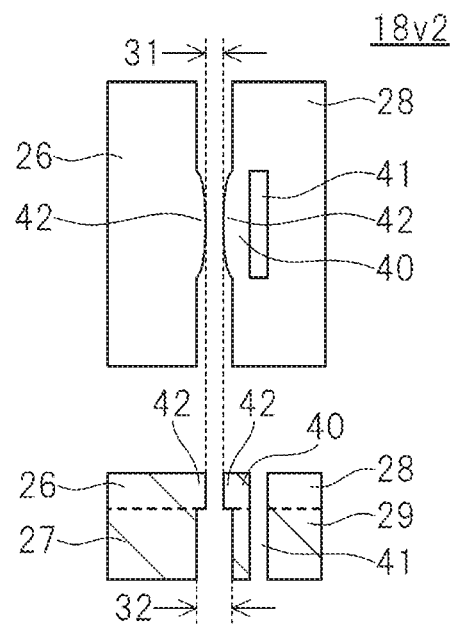
[FIG. 5] (a)
[FIG. 5] (b)
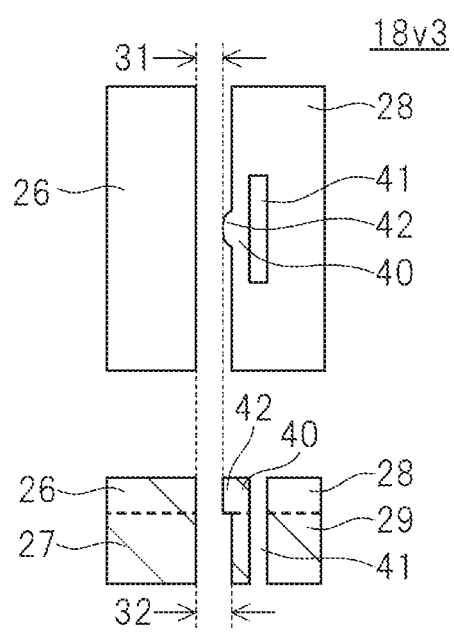
[FIG. 6] (a)
[FIG. 6] (b)

[FIG. 7] (a) 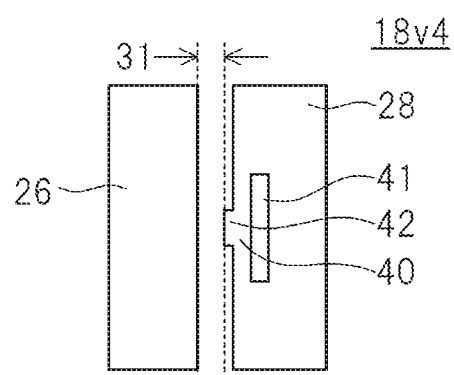
[FIG. 7] (b) 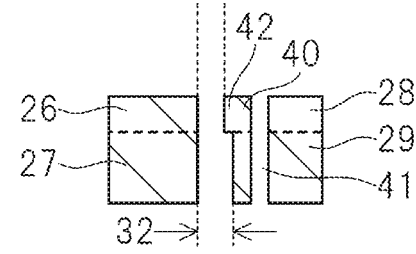
[FIG. 8] (a) 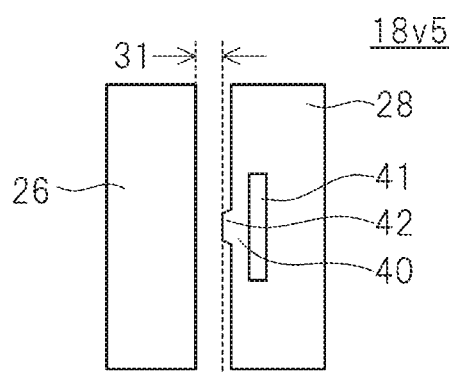
[FIG. 8] (b) 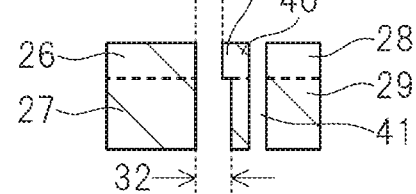

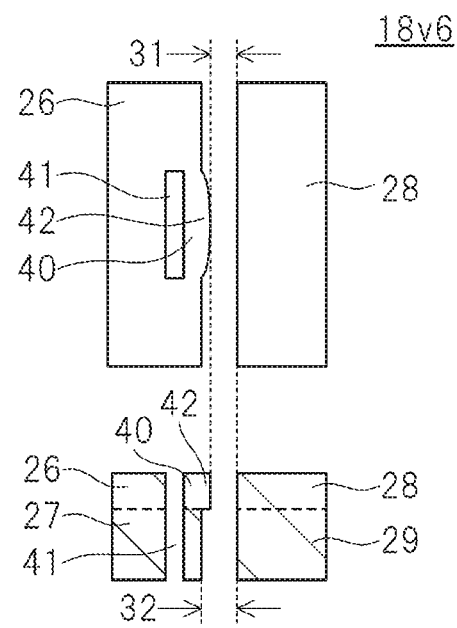
[FIG. 9] (a)
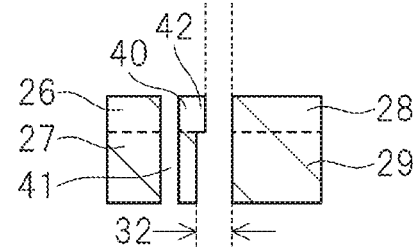
[FIG. 9] (b)
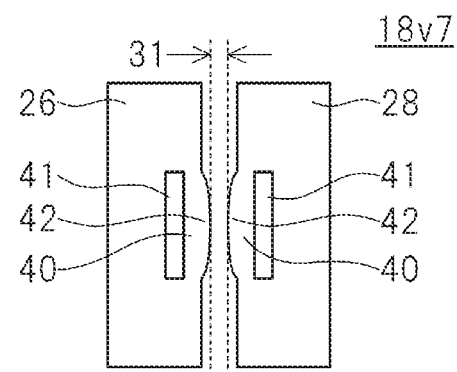
[FIG. 10] (a)
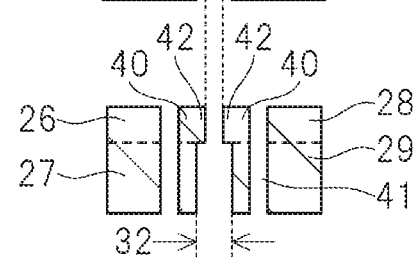
[FIG. 10] (b)

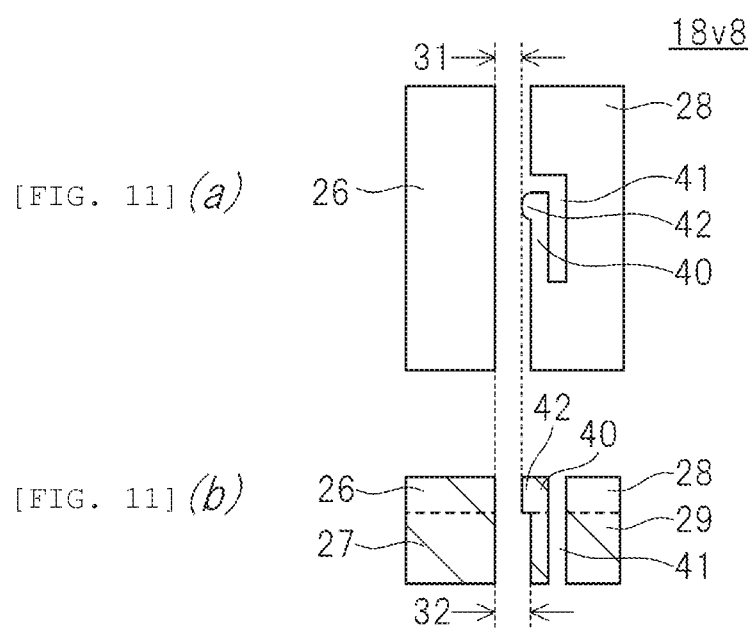

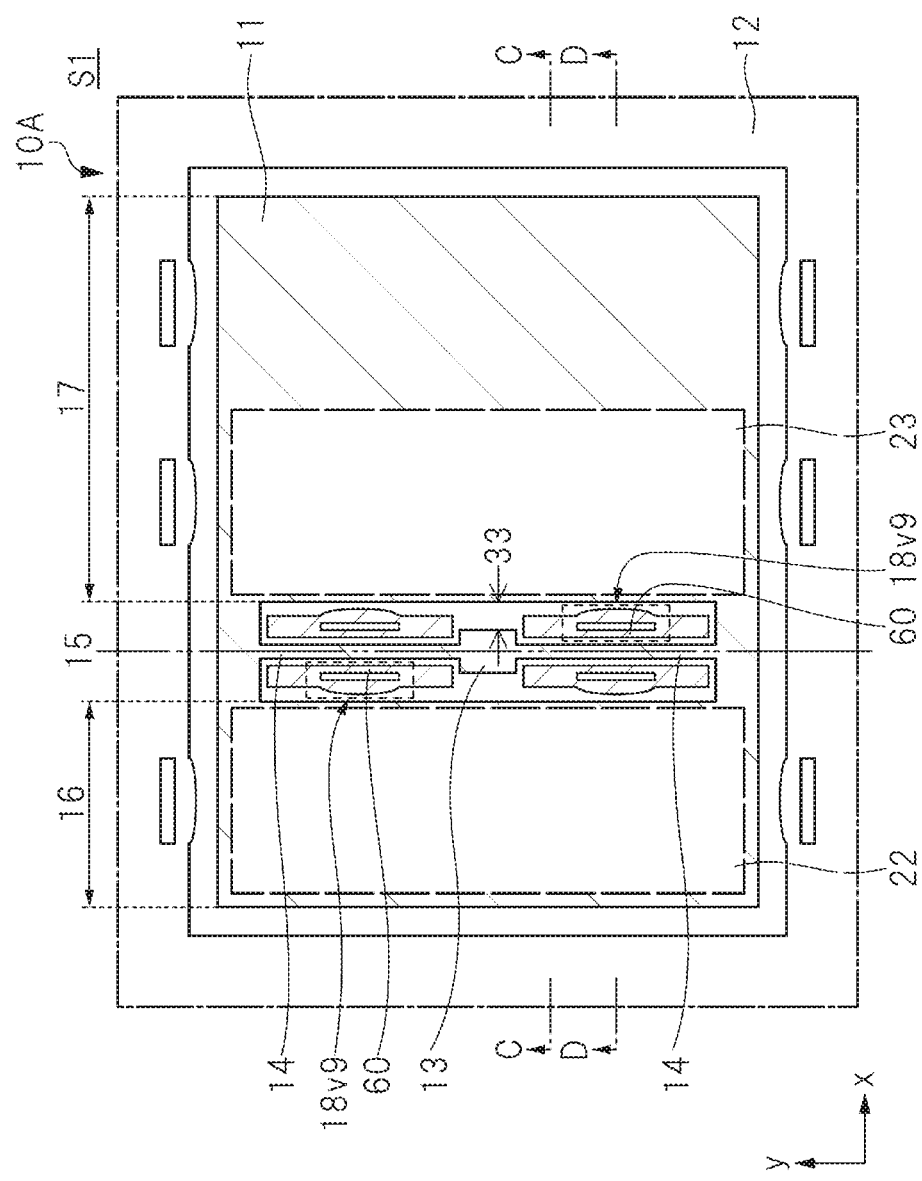
[Fig. 12]

[FIG. 13] (a)
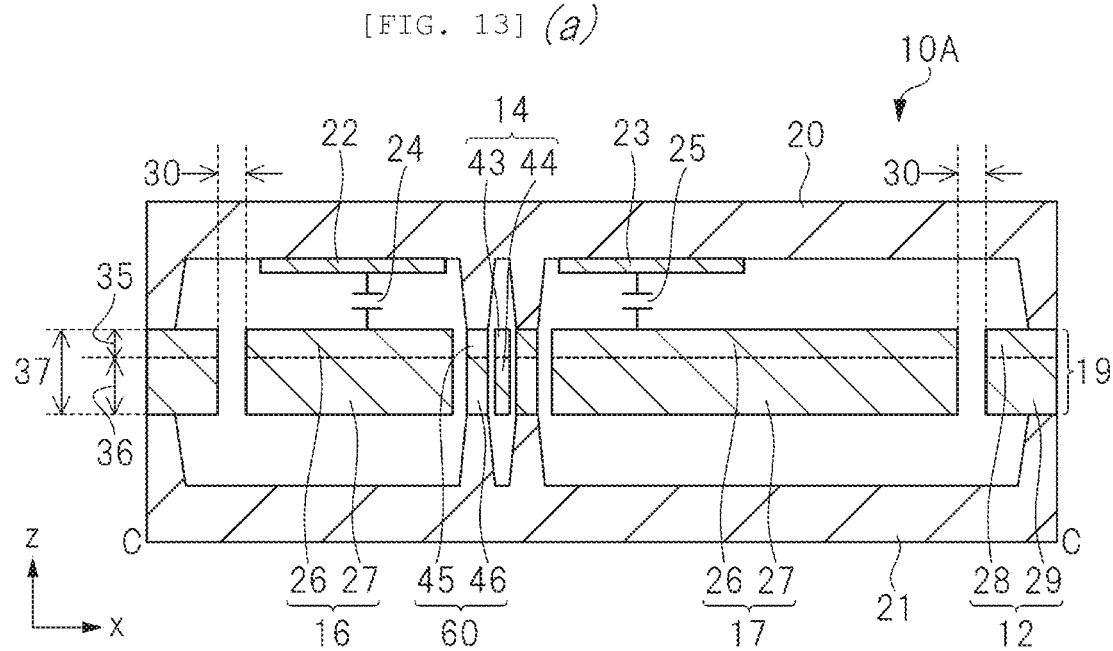
[FIG. 13] (b)
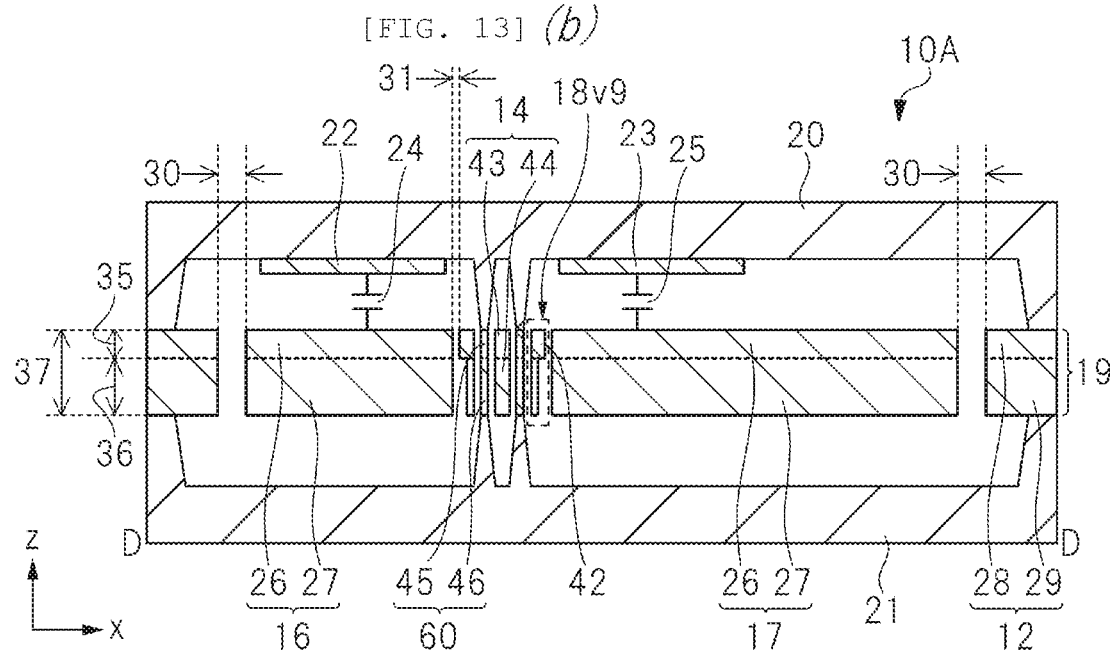

[Fig. 14]
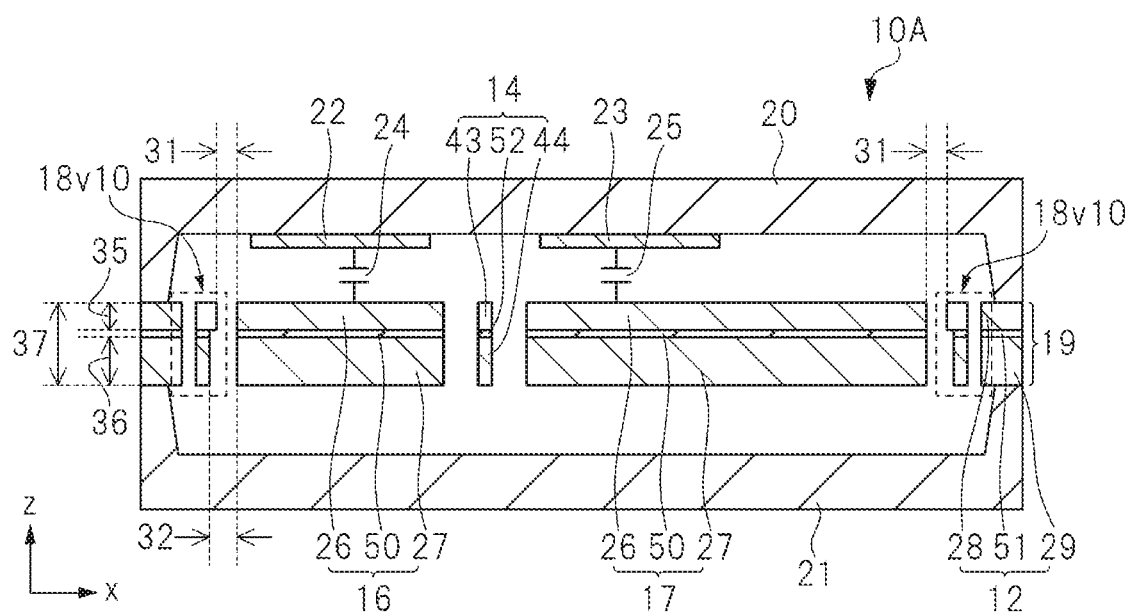

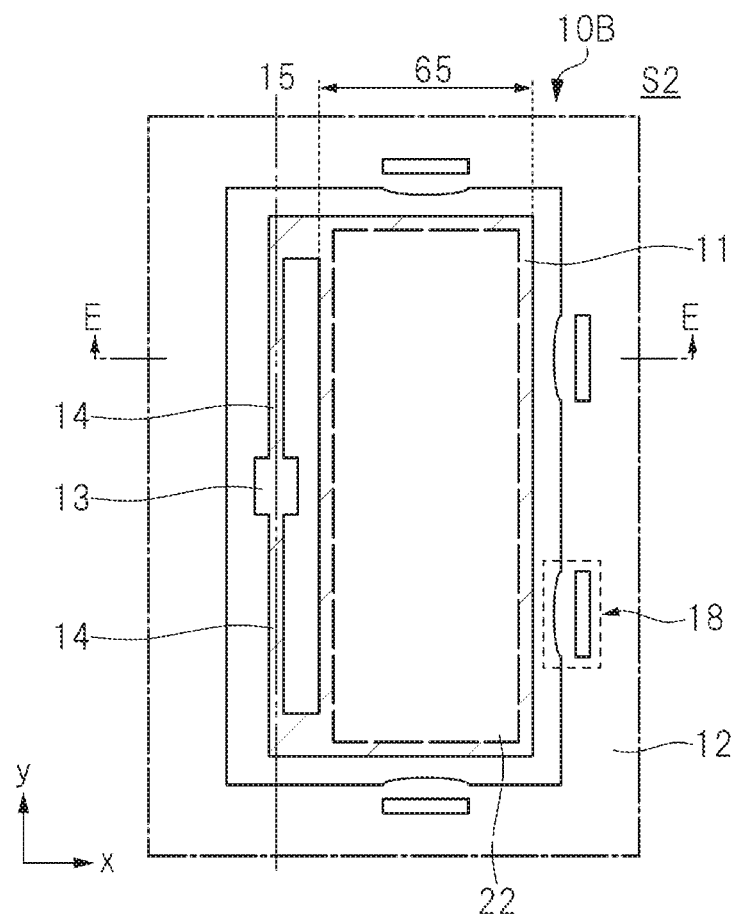
[Fig. 15]

[Fig. 16]
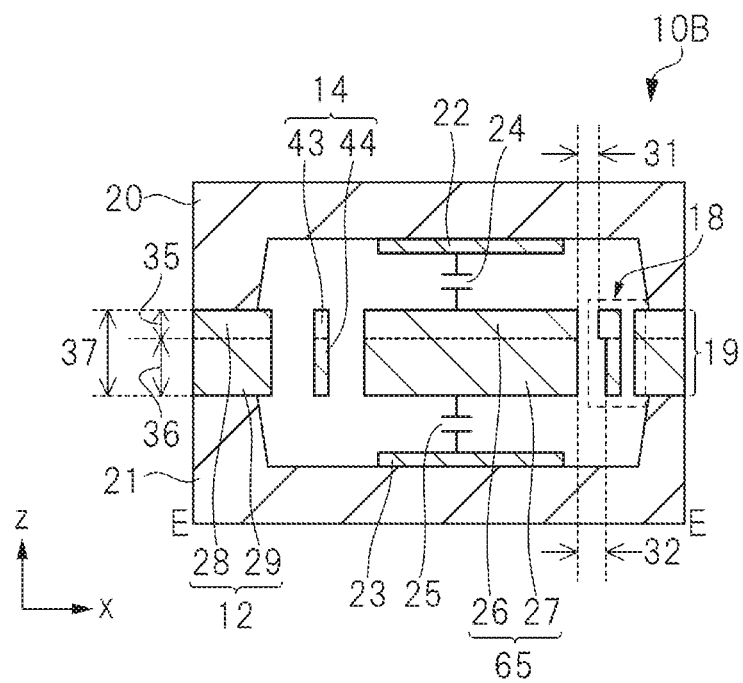

[Fig. 17]
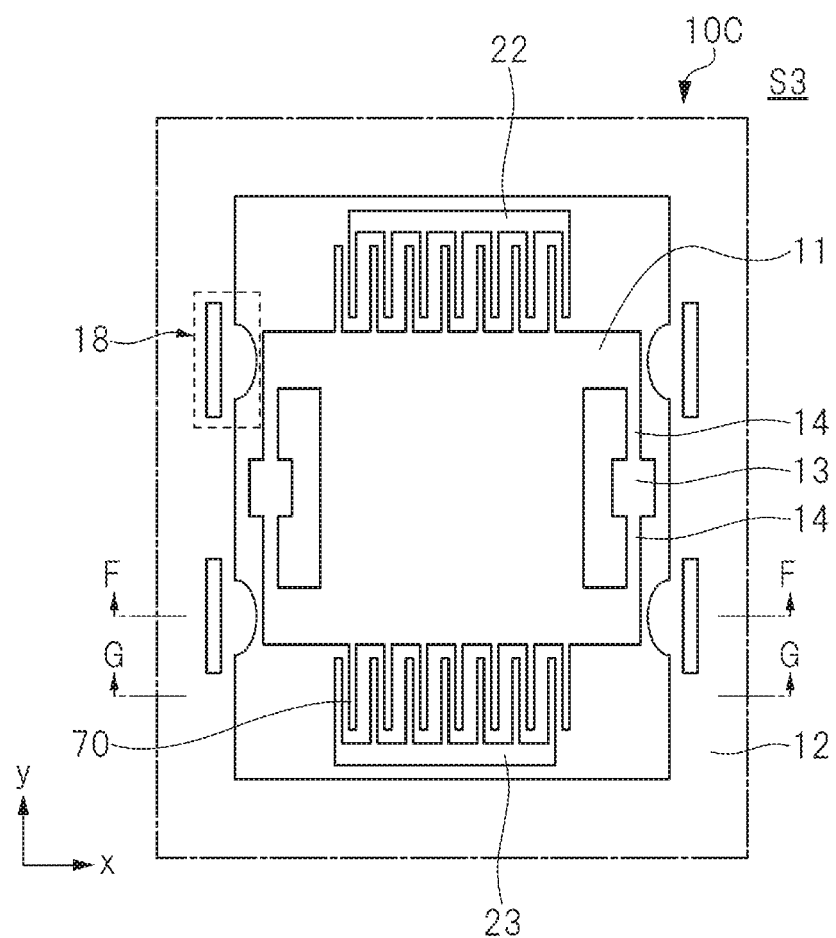

[Fig. 18] (a)
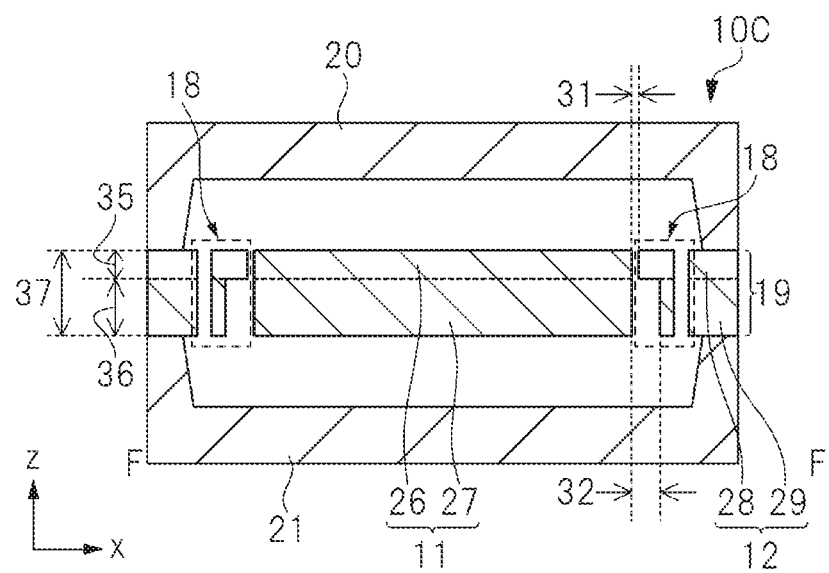
[Fig. 18] (b)
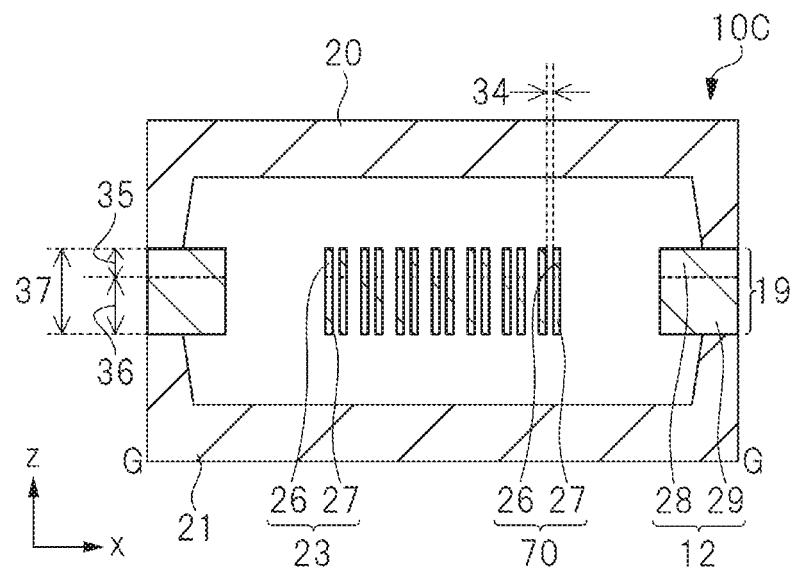

ACCELERATION SENSOR

CROSS-REFERENCE TO RELATED APPLICATION

The present application claims priority from Japanese Patent Application No. 2017-40290 filed on Mar. 3, 2017, the content of which is hereby incorporated by reference into this application.

TECHNICAL FIELD

The present invention relates to an acceleration sensor.

BACKGROUND ART

As a background art in this technical field, there are Japanese Patent No. 4636220 (PTL 1) and JP-A-2011-148084 (PTL 2).

Japanese Patent No. 4636220 (PTL 1) describes an angular velocity detection device including a stopper that regulates a displacement amount of a vibrator relative to a fixed portion, and impact buffering means for buffering impact force of collision between the stopper and the vibrator. The impact buffering means includes an etching hole which is set largely, a semi-annular elastic piece or an inclined portion, or the like.

JP-A-2011-148084 (PTL 2) describes a manufacturing process of a micromechanical structure that forms stop means for limiting the displacement of a movable portion in a direction substantially perpendicular to a laminate, using at least one sacrificial layer between a substrate and the laminate.

CITATION LIST

Patent Literature

PTL 1: Japanese Patent No. 4636220
PTL 2: JP-A-2011-148084

SUMMARY OF INVENTION

Technical Problem

Reflection seismic survey is a method of generating shock waves or continuous waves on the surface of the earth to measure and analyze reflected waves, which are reflected from the underground reflective surface (a boundary surface where acoustic impedance changes) and return to the ground, by geophones installed on the ground surface, and exploring the depth distribution and subsurface structure of the underground reflection surface. For example, the reflection seismic survey is widely used as a method of exploring petroleum and natural gas.

However, in the reflection seismic survey, an acceleration sensor that detects a vibration acceleration which is much smaller than gravity acceleration is used. In particular, in the next generation reflection seismic survey, it is desired that an acceleration sensor is realized by a Micro Electro Mechanical Systems (MEMS) technology in order to operate the acceleration sensor in a small apparatus. In order to realize an acceleration sensor with low noise and high sensitivity by the MEMS technology, it is indispensable to increase the mass of a movable portion. Furthermore, in addition to this, high impact resistance exceeding 1000 g is required for oil and natural gas exploration use.

Therefore, the present invention provides an acceleration sensor having a large mass in a movable portion, and realizing high impact resistance.

Solution to Problem

In order to solve the problems, there is provided an acceleration sensor including an upper substrate; a lower substrate spaced apart from the upper substrate; and an intermediate substrate provided between the upper substrate and the lower substrate and including a first part on the upper substrate side and a second part on the lower substrate side. The intermediate substrate includes a fixed portion fixed to the upper substrate and the lower substrate, a movable portion displaceable with respect to the fixed portion, a frame portion provided outside the movable portion while being spaced apart from the movable portion, and an elastic portion provided at one end of the frame portion so as to face the movable portion. The movable portion is configured with a first movable layer including the first part and a second movable layer including the second part, the elastic portion is configured with a first elastic layer including the first part and a second elastic layer including the second part, and a shortest distance between an end portion of the first elastic layer and an end portion of the first movable layer which face each other, and a second shortest distance between an end portion of the second elastic layer and an end portion of the second movable layer which face each other are different from each other.

Advantageous Effects of Invention

According to the present invention, it is possible to provide an acceleration sensor having a large mass in a movable portion and realizing high impact resistance.

The problems, configurations, and effects other than those described above will be clarified by the following description of the embodiments.

BRIEF DESCRIPTION OF DRAWINGS

FIG. 1 is a plan view showing a structure of a sensor element of an acceleration sensor according to Embodiment 1.

FIG. 2(a) is a cross-sectional view taken along line A-A of FIG. 1, and FIG. 2(b) is a cross-sectional view taken along line B-B of FIG. 1.

FIG. 3(a) and FIG. 3(b) are a plan view and a sectional view, respectively, showing a stopper portion in FIG. 1 in an enlarged manner.

FIG. 4(a) and FIG. 4(b) are a plan view and a sectional view, respectively, showing a first modification example of the stopper portion in FIG. 1 in an enlarged manner.

FIG. 5(a) and FIG. 5(b) are a plan view and a sectional view, respectively, showing a second modification example of the stopper portion in FIG. 1 in an enlarged manner.

FIG. 6(a) and FIG. 6(b) are a plan view and a sectional view, respectively, showing a third modification example of the stopper portion in FIG. 1 in an enlarged manner.

FIG. 7(a) and FIG. 7(b) are a plan view and a sectional view, respectively, showing a fourth modification example of the stopper portion in FIG. 1 in an enlarged manner.

FIG. 8(a) and FIG. 8(b) are a plan view and a sectional view, respectively, showing a fifth modification example of the stopper portion in FIG. 1 in an enlarged manner.

FIG. 9(a) and FIG. 9(b) are a plan view and a sectional view, respectively, showing a sixth modification example of the stopper portion in FIG. 1 in an enlarged manner.

FIG. 10(a) and FIG. 10(b) are a plan view and a sectional view, respectively, showing a seventh modification example of the stopper portion in FIG. 1 in an enlarged manner.

FIG. 11(a) and FIG. 11(b) are a plan view and a sectional view, respectively, showing an eighth modification example of the stopper portion in FIG. 1 in an enlarged manner.

FIG. 12 is a plan view showing a structure of a sensor element of an acceleration sensor according to a ninth modification example of Embodiment 1.

FIG. 13(a) is a cross-sectional view taken along line C-C of FIG. 12, and FIG. 13(b) is a cross-sectional view taken along line D-D of FIG. 12.

FIG. 14 is a cross-sectional view showing a structure of a sensor element of an acceleration sensor according to a tenth modification example of Embodiment 1.

FIG. 15 is a plan view showing a structure of a sensor element of an acceleration sensor according to Embodiment 2.

FIG. 16 is a cross-sectional view taken along line E-E of FIG. 15.

FIG. 17 is a plan view showing a structure of a sensor element of an acceleration sensor according to Embodiment 3.

FIG. 18(a) is a cross-sectional view taken along line F-F of FIG. 17, and FIG. 18(b) is a cross-sectional view taken along line G-G of FIG. 17.

DESCRIPTION OF EMBODIMENTS

Hereinafter, embodiments will be described in detail with reference to the drawings. In addition, in all of the drawings for describing the embodiments, the same or related reference numerals will be given to the members having the same functions, and the repetitive description thereof will be omitted. In addition, in a case where there are a plurality of similar members (parts), individual or specific parts may be indicated by adding a symbol to the generic sign. In the following embodiments, the description of the same or similar parts will not be repeated in principle unless it is particularly necessary.

In the drawings used in the embodiments, hatching may be omitted in order to make the drawings easy to see even in cross-sectional views. Even in a plan view, hatching may be added to make drawings easy to see.

In addition, in the cross-sectional views and the plan views, the size of each part does not correspond to an actual device, and in order to make the drawing easy to understand, a specific part may be illustrated relatively large. Further, even when the cross-sectional views and the plan views correspond to each other, in order to make the drawing easy to understand, a specific part may be illustrated relatively large.

Further, in the following description, two directions which intersect with each other, preferably are perpendicular to each other, in plan view, are set to an x direction and a y direction, and a direction perpendicular to an xy plan is set to a z direction. Further, "In plan view" means a case viewed from the z direction.

<Room for Improvement>

In the technique described in PTL 1, in an angular velocity detection device, a stopper that regulates a displacement amount of a vibrator with respect to a fixed portion is provided, and by giving elasticity to the stopper, means for buffering impact force of collision between the stopper and the vibrator when regulating the displacement amount of the vibrator with respect to the fixed portion is described. Thus, damage to the stopper and the vibrator due to the collision can be prevented. However, there are ductile fracture and brittle fracture accompanied by plastic deformation in the damage to the stopper and the vibrator due to the collision, and there is a problem that brittle fracture hardly occurs and ductile fracture is likely to occur, when the elasticity of the stopper increases In particular, in a MEMS device having a large mass in a movable portion, it is difficult to prevent both ductile fracture and brittle fracture when a strong impact is applied.

In the technique described in PTL 2, a stopper that regulates the displacement amount in the vertical (out-of-plane) direction with respect to the fixed portion of the vibrator (movable portion) is provided. However, means for regulating the displacement amount in the horizontal (in-plane) direction with respect to the fixed portion of the vibrator is not described, and in the case where a strong impact is applied in the horizontal direction, it is difficult to prevent both ductile fracture and brittle fracture.

Therefore, in this embodiment, study is made on the room for improvement in the above-described related art. Hereinafter, the technical idea of this embodiment which has been devised will be described with reference to the drawings.

Embodiment 1

<Characteristics and Effects of Configuration of Acceleration Sensor>

The characteristics and effects of a configuration of an acceleration sensor according to Embodiment 1 will be described using FIG. 1 and FIGS. 2(a) and 2(b). FIG. 1 is a plan view showing a structure of a sensor element of an acceleration sensor according to Embodiment 1. FIG. 2(a) is a cross-sectional view taken along line A-A of FIG. 1. FIG. 2(b) is a cross-sectional view taken along line B-B of FIG. 1. In FIG. 1, a mass body and a part of a frame portion in the vicinity thereof are shown, and fixed electrodes provided on the upper substrate opposed to the mass body are indicated by broken lines.

As shown in FIG. 1 and FIGS. 2(a) and 2(b), an acceleration sensor element 10A constituting the acceleration sensor S1 according to Embodiment 1 includes a frame which collectively refers to a upper substrate 20, a lower substrate 21, and a frame portion 12, a fixed portion 13 fixed between the upper substrate 20 and the lower substrate 21 of the frame, and a first movable portion 16 and a second movable portion 17 which are movable portions displaceable in a predetermined direction with respect to the fixed portion 13. In particular, the acceleration sensor S1 according to Embodiment 1 is an acceleration sensor using a MEMS technology having a large mass in a movable portion.

As shown in FIG. 1 and FIGS. 2(a) and 2(b), the acceleration sensor element 10A is configured with three layers of an intermediate substrate 19, the upper substrate 20, and the lower substrate 21, and the intermediate substrate 19 includes a mass body 11 (the first movable portion 16 and the second movable portion 17), the frame portion 12, the fixed portion 13, and a spring portion 14. The intermediate substrate 19, the upper substrate 20, and the lower substrate 21 are made of, for example, silicon, and the upper substrate 20 is provided in the z direction from the lower substrate 21. When a signal (acceleration) is applied to the acceleration sensor element 10A from the outside, the mass body 11 vibrates around the rotation axis 15 provided in the y direction orthogonal to the z direction, through the spring portion 14 supported by the fixed portion 13.

The mass body 11 includes a first movable portion 16 located in the −x direction and a second movable portion 17 located in the +x direction in a case where the x coordinate of the rotation axis 15 is set to 0, and the first movable portion 16 and the second movable portion 17 have different masses from each other. In the acceleration sensor element 10A, the mass of the second movable portion 17 can be made larger than the mass of the first movable portion 16 by setting the length in the x direction of the second movable portion 17 longer than the length in the x direction of the first movable portion 16, but the method of forming the difference in mass is not limited to this. That is, the lengths in the y direction of the first movable portion 16 and the second movable portion 17 may be different, and the thicknesses in the z direction may be different from each other.

A first signal detection electrode 22 is disposed on a surface of the upper substrate 20 that faces the first movable portion 16, and a first signal detecting capacitive element 24 is formed between the first movable portion 16 and the first signal detection electrode 22. Further, a second signal detection electrode 23 is disposed on a surface of the upper substrate 20 that faces the second movable portion 17, and a second signal detecting capacitive element 25 is formed between the second movable portion 17 and the second signal detection electrode 23. It is preferable that the first signal detection electrode 22 and the second signal detection electrode 23 are disposed so as to be symmetrical with each other with respect to the rotation axis 15.

The first signal detecting capacitive element 24 and the second signal detecting capacitive element 25 are capacitive elements for detecting the application of acceleration in the z direction. That is, acceleration is detected by detecting the capacitance change of the first signal detecting capacitive element 24 and the capacitance change of the second signal detecting capacitive element 25, which occurs in a case where acceleration in the z direction is applied to the mass body 11. At this time, since the capacitance change of the first signal detecting capacitive element 24 and the capacitance change of the second signal detecting capacitive element 25 are opposite in phase, for a certain acceleration, differential detection becomes possible by applying detection voltages of opposite phases to the first signal detection electrode 22 and the second signal detection electrode 23. However, in principle, acceleration detection becomes possible if either one of the first signal detecting capacitive element 24 and the second signal detecting capacitive element 25 is present. Even with such a configuration, it goes without saying that there is no problem.

Since the acceleration sensor element 10A is a sensor that detects the acceleration in the z direction, the stopper portion 18 is provided so that excessive displacement on the xy plane of the mass body 11 does not occur with respect to the acceleration in the xy plane direction. By providing the stopper portion 18, damage to the spring portion 14 can be prevented even if the mass body 11 excessively displaces on the xy plane, for example. Further, it is desirable that the stopper portion 18 has elasticity, in order to alleviate the impact force when the mass body 11 collides with the stopper portion 18. As means having elasticity, for example, a method in which the stopper portion 18 is formed into a both-end fixed beam structure can be considered.

However, in a case where the mass of the mass body 11 is large or a high impact is applied, the mass body 11, the stopper portion 18, or both are damaged, which may adversely affect the performance of the acceleration sensor element 10A. As means to prevent this, while retaining elasticity (shape) to the extent that brittle fracture can be suppressed, enlarging the stopper portion 18 to the extent that ductile fracture can be suppressed, shortening the distance between the mass body 11 and the stopper portion 18 to reduce the impact force at the time of a collision, or the like is conceivable.

However, the enlargement of the stopper portion 18 has a limit due to restrictions on the plane size of the acceleration sensor element 10A and restrictions on the thickness of the mass body 11.

Further, shortening the distance between the mass body 11 and the stopper portion 18 has restrictions on manufacturing. Normally, the mass body 11 and the frame portion 12 are formed by forming a mask pattern on a silicon substrate by photolithography or the like and then processing the silicon substrate into a desired shape by an etching process. At this time, generally, as the depth of processing becomes deeper, the processing accuracy deteriorates, and the minimum width that can be processed also increases. For example, in a case where the mass body 11 and the frame portion 12 are formed using a silicon substrate, the distance 30 between the mass body 11 and the frame portion 12 is limited to about 1/20 of the thickness of the mass body 11. For example, in a case where the thickness of the mass body 11 is about 440 µm, the distance 30 between the mass body 11 and the frame portion 12 is required to be 22 µm to 23 µm. In particular, in a case where the thickness of the mass body 11 is increased in order to increase the mass of the mass body 11, it is difficult to shorten the distance 30 between the mass body 11 and the frame portion 12.

Therefore, in the acceleration sensor element 10A, the structure of the stopper portion 18 and the forming method thereof are devised. Specifically, the mass body 11, the frame portion 12, the fixed portion 13, and the spring portion 14 constituting the intermediate substrate 19 each are configured to have a two-layer structure of an upper layer and a lower layer. For example, the first movable portion 16 and the second movable portion 17, which are parts of the mass body 11, each are configured with a first movable layer 26 which is a upper layer and a second movable layer 27 which is a lower layer. The frame portion 12 is configured with a first frame layer 28 which is a upper layer and a second frame layer 29 which is a lower layer, the fixed portion 13 is configured with a first fixed layer 38 which is a upper layer and a second fixed layer 39 which is a lower layer, and the spring portion 14 is configured with a first spring layer 43 which is a upper layer and a second spring layer 44 which is a lower layer. The first movable layer 26, the first frame layer 28, the first fixed layer 38, and the first spring layer 43 each are formed of the same layer, and the second movable layer 27, the second frame layer 29, the second fixed layer 39, and the second spring layer 44 each are formed of the same layer.

In this way, the mass body 11, the frame portion 12, the fixed portion 13, and the spring portion 14 constituting the intermediate substrate 19 each have a two-layer structure of an upper layer and a lower layer, it is possible to shorten the distance between the mass body 11 and the stopper portion 18 without restricting the thickness of the intermediate substrate 19. Here, the upper layer (the first movable layer 26, the first frame layer 28, the first fixed layer 38, and the first spring layer 43) and the lower layer (the second movable layer 27, the second frame layer 29, the second fixed layer 39, and the second spring layer 44) are not formed using two different silicon substrates, but are formed using one silicon substrate. In other words, the same intermediate substrate 19 is merely referred to as the upper layer or the lower layer, depending on a difference in function, for convenience.

In the acceleration sensor element 10A, the upper layer and the lower layer are formed of one silicon substrate, but the present invention is not limited thereto. For example, two silicon substrates different from each other may be bonded together, one silicon substrate can be the upper layer, and the other silicon substrate can be the lower layer.

Hereinafter, the features of the acceleration sensor element 10A will be described in more detail.

In the acceleration sensor element 10A, a plurality of stopper portions 18 that regulate the displacement amount on the xy plane of the mass body 11 are formed in the frame portion 12. In FIG. 1, ten stopper portions 18 are illustrated. The stopper portion 18 has an elastic portion and a slit portion, and is able to alleviate the impact force by bending in a direction of impact when it is impacted by the mass body 11. The elastic portion of the stopper portion 18 is configured with the first frame layer 28 which is the upper layer and the second frame layer 29 which is the lower layer, and the distance 31 between the end portion of the first movable layer 26 and the end portion of the first frame layer 28 which are the upper layers and the distance 32 between the end portion of the second movable layer 27 and the end portion of the second frame layer 29 which are the lower layers are different from each other. That is, the end portion of the first movable layer 26 and the end portion of the second movable layer 27, which face the stopper portion 18, are in a straight line in the z direction in a cross-sectional view taken along the x direction. However, the shape of the first frame layer 28 and the shape of the second frame layer 29 in the elastic portion of the stopper portion 18 are different from each other, and the end portions of the first frame layer 28 and the second frame layer 29 constituting the elastic portion of the stopper portion 18 facing the first movable portion 16 or the second movable portion 17 are not in a straight line in the z direction in a cross sectional view taken along the x direction.

The structure of such an acceleration sensor element 10A can be realized by processing the intermediate substrate 19 from the upper surface and the lower surface. For example, first, the intermediate substrate 19 is etched in the +z direction (upper surface side) to form the first movable layer 26, the first frame layer 28, the first fixed layer 38, and the first spring layer 43, which are upper layers. Thereafter, etching is performed in the −z direction (lower surface side) to form the second movable layer 27, the second frame layer 29, the second fixed layer 39, and the second spring layer 44, which are lower layers.

Thus, the processing depth of the first movable layer 26, the first frame layer 28, the first fixed layer 38, and the first spring layer 43 is the thickness 35, and the processing depth of the second movable layer 27, the second frame layer 29, the second fixed layer 39, and the second spring layer 44 is the thickness 36. Then, the processing depth of the first movable layer 26, the first frame layer 28, the first fixed layer 38, and the first spring layer 43, and the processing depth of the second movable layer 27, the second frame layer 29, the second fixed layer 39, and the second spring layer 44 can be made shallower than the thickness 37 of the intermediate substrate 19 which is the sum of the thickness 35 and the thickness 36. For example, in a case where the thickness 37 of the intermediate substrate 19 is about 440 µm, the thickness 35 of the first movable layer 26, the first frame layer 28, the first fixed layer 38, and the first spring layer 43, which are the upper layers, can be set to about 60 µm, and the thickness 36 of the second movable layer 27, the second frame layer 29, the second fixed layer 39, and the second spring layer 44, which are the lower layers, can be set to about 380 µm.

The effect of this is that since the distance 31 between the end portions of the first movable layer 26 and the first frame layer 28 which are upper layers, and the distance 32 between the end portions of the second movable layer 27 and the second frame layer 29 which are lower layers can be determined without restricting the thickness 37 of the intermediate substrate 19, the shortest distance between the mass body 11 and the stopper portion 18 can be made shorter than in the case where the intermediate substrate 19 is not divided into the upper layer and the lower layer. For example, in a case where the thickness of the mass body 11 is about 440 µm, the distance 31 between the mass body 11 and the stopper portion 18 can be 3 µm to 5 µm. This can suppress the impact force when the mass body 11 collides with the stopper portion 18.

When it is desired to adjust the shortest distance between the mass body 11 and the stopper portion 18 to a desired value, the thickness of the intermediate substrate 19 is first determined. Thereafter, the thickness of the first movable layer 26, the first frame layer 28, the first fixed layer 38, and the first spring layer 43, which are the upper layers that can be processed at the shortest distance, or the thickness of the second movable layer 27, the second frame layer 29, the second fixed layer 39, and the second spring layer 44, which are the lower layers, may be determined. In this case, in a case where the thickness 35 of the upper layer is set to be thinner than the thickness 36 of the lower layer, it is natural to perform processing so that the distance 31 becomes shorter than the distance 32.

FIGS. 2(a) and 2(b) show the case where the thickness 35 of the upper layer is thinner than the thickness 36 of the lower layer and the distance 31 in the upper layer is shorter than the distance 32 in the lower layer. However, the magnitude relationship between the thickness 35 of the upper layer and the thickness 36 of the lower layer and the magnitude relationship between the distance 31 in the upper layer and the distance 32 in the lower layer are not limited thereto. However, hereinafter, for the sake of simplicity, the case where the thickness 35 of the upper layer is thinner than the thickness 36 of the lower layer and the distance 31 in the upper layer is shorter than the distance 32 in the lower layer will be described as an example, but the scope of application of the present invention is not limited thereto.

In order to regulate the displacement amount of the mass body 11 by the stopper portion 18, it is necessary that at least the distance 31 in the upper layer is formed to be shorter than the shortest distance 30 between the mass body 11 and the frame portion 12 where the stopper portion 18 is not formed and the shortest distance 33 between the mass body 11 and the fixed portion 13.

Further, in a case where the shape of the stopper portion 18 is, for example, a both-end fixed beam structure, it is desirable to devise a shape such that the center of the both-end fixed beam structure is a contact point between the mass body 11 and the stopper portion 18, such as forming the shape of the stopper portion 18 in the first frame layer 28 into a semicircular arc shape in a plan view.

Modification Example of Embodiment 1

Modification examples of Embodiment 1 will be described with reference to FIGS. 3(a) and 3(b) to FIGS.

14(*a*) and 14(*b*). FIGS. 3(*a*) and 3(*b*) are a plan view and a sectional view, respectively, showing the stopper portion 18 in FIG. 1 in an enlarged manner. FIG. 4 to FIGS. 11(*a*) and 11(*b*) are plan views and sectional views, respectively, showing a first modification example to an eighth modification example of the stopper portion 18 in FIG. 1 in an enlarged manner. FIG. 12 is a plan view showing a structure of a sensor element of an acceleration sensor according to a ninth modification example of Embodiment 1. FIG. 13(*a*) is a cross-sectional view taken along line C-C of FIG. 12. FIG. 13(*b*) is a cross-sectional view taken along line D-D of FIG. 12. FIG. 14 is a cross-sectional view showing a structure of a sensor element of an acceleration sensor according to a tenth modification example of Embodiment 1.

FIGS. 3(*a*) and 3(*b*) show a stopper portion 18 adopting a both-end fixed beam as an elastic structure, which is Embodiment 1 shown in FIG. 1, and an elastic portion 40 including a first frame layer 28 and a second frame layer 29 is realized by forming a slit portion 41 in the first frame layer 28 and the second frame layer 29. At this time, a semicircular protruding portion 42 is provided in plan view in the first frame layer 28 so as to be contact with the first movable layer 26 at the center portion of the both-end fixed beam. Further, the protruding portion 42 functions as a part of the elastic portion 40. With this structure, with respect to the stopper portion 18, it is possible to shorten the distance 31 in the upper layer, after ensuring the size corresponding to the total thickness of the first frame layer 28 and the second frame layer 29.

FIGS. 4(*a*) and 4(*b*) show a stopper portion 18*v*1 according to a first modification example of Embodiment 1, in which a protruding portion 42 is formed in the first movable layer 26. In this way, the protruding portion 42 may be formed in the first movable layer 26.

FIGS. 5(*a*) and 5(*b*) show a stopper portion 18*v*2 according to a second modification example of Embodiment 1 (a combination of Embodiment 1 and the first modification example), in which the protruding portions 42 are formed on both the first movable layer 26 and the first frame layer 28. In this way, the protruding portions 42 may be formed in both the first movable layer 26 and the first frame layer 28. In addition, the shape of the protruding portion 42 formed in the first movable layer 26 and the shape of the protruding portion 42 formed in the first frame layer 28 may not be the same. However, it is preferable that the protruding portion 42 formed in the first movable layer 26 and the protruding portion 42 formed in the first frame layer 28 are formed by a combination of upper layers or a combination of lower layers.

FIGS. 6(*a*) and 6(*b*) show a stopper portion 18*v*3 according to a third modification example of Embodiment 1, in which the shape of the protruding portion 42 is semicircular in a plan view, but is smaller than the protruding portion 42 of Embodiment 1 shown in FIG. 1.

FIGS. 7(*a*) and 7(*b*) show a stopper portion 18*v*4 according to a fourth modification example of Embodiment 1, in which the shape of the protruding portion 42 is a quadrangle in plan view.

FIGS. 8(*a*) and 8(*b*) show a stopper portion 18*v*5 according to a fifth modification example of Embodiment 1, in which the shape of the protruding portion 42 is trapezoidal in plan view.

As shown in FIGS. 6(*a*) and 6(*b*) to FIGS. 8(*a*) and 8(*b*), as long as the size and shape of the protruding portion 42 do not significantly affect the function of the elastic portion 40, any size and shape may be used. Further, the protruding portions 42 shown in FIGS. 6(*a*) and 6(*b*) to FIGS. 8(*a*) and 8(*b*) may be formed on the first movable layer 26 as shown in FIGS. 4(*a*) and 4(*b*), or may be formed on both the first movable layer 26 and the and first frame layer 28 as shown in FIGS. 5(*a*) and 5(*b*).

FIGS. 9(*a*) and 9(*b*) show a stopper portion 18*v*6 according to a sixth modification example of Embodiment 1, in which the elastic portion 40 is formed on the first movable layer 26 and the second movable layer 27, and the protruding portion 42 is formed on the first movable layer 26. That is, the stopper portion 18*v*6 is formed on the mass body 11 side. In this way, the stopper portion 18*v*6 may be formed not on the frame portion 12 side but on the mass body 11 side.

FIGS. 10(*a*) and 10(*b*) show a stopper portion 18*v*7 according to a seventh modification example of Embodiment 1 (a combination of Embodiment 1 and the sixth modification example), in which the stopper portion 18*v*7 is formed on both the mass body 11 side and the frame portion 12 side, and the protruding portion 42 is formed on both the first movable layer 26 and the first frame layer 28. In this way, the stopper portion 18*v*7 may be formed both on the mass body 11 side and the frame portion 12 side.

FIGS. 11(*a*) and 11(*b*) show a stopper portion 18*v*8 according to an eighth modification example of Embodiment 1, in which the elastic portion 40 is formed into a cantilevered beam structure. At this time, a protruding portion 42 is provided on the first frame layer 28 so as to be contact with the first movable layer 26 at the tip portion of the cantilevered beam.

As described above, the elastic portions 40 having elasticity has a plurality of shapes, and the applicable range of the present invention is not limited by the shape of the elastic portion 40. In addition, as described above, there are numerous combinations of the position of the stopper portion 18, the size of the protruding portion 42, the shape of the protruding portion 42, and the like, but the application range of the present invention is not restricted by the difference in the combinations.

FIG. 12 and FIGS. 13(*a*) and 13(*b*) are a ninth modification example of Embodiment 1, in which a stopper portion 18*v*9 is formed in the fixed column 60 located inside the mass body 11 in plan view. As shown in FIGS. 13(*a*) and 13(*b*), the fixed column 60 is formed to support the upper substrate 20 and the lower substrate 21, and is provided to prevent deformation or distortion of the upper substrate 20 and the lower substrate 21 that may occur during manufacturing process of the acceleration sensor element 10A. Similar to the mass body 11, the frame portion 12, and the like, the fixed column 60 also includes a third fixed layer 45 which is an upper layer and a fourth fixed layer 46 which is a lower layer. As described above, the fixed column 60 is disposed inside the mass body 11 according to its preferable size and positional relationship, and its shape, size and disposed position are not limited to those shown in FIG. 12, and FIGS. 13(*a*) and 13(*b*).

Further, as shown in FIG. 12 and FIG. 13(*b*), the stopper portion 18*v*9 is formed in a part of the fixed column 60. The shortest distance 31 between the mass body 11 (the first movable portion 16 or the third movable portion 17) and the protruding portion 42 formed in the stopper portion 18*v*9 is shorter than the shortest distance 30 between the mass body 11 and the frame portion 12, and the shortest distance 33 between the mass body 11 and the fixed portion 13. In this manner, the stopper portion 18*v*9 may be formed in a position other than the mass body 11 and the frame portion 12.

FIG. 14 shows a tenth modification example of Embodiment 1, in which the intermediate substrate 19 has an intermediate layer between the upper layer and the lower layer, and the intermediate substrate 19 has a three-layer structure including the upper layer, the lower layer, and the intermediate layer. That is, a third movable layer 50, a third frame layer 51, a third fixed layer (not shown), and a third spring layer 52 constituting intermediate layer are respectively formed between the first movable layer 26, the first frame layer 28, the first fixed layer (not shown), and the first spring layer 43 constituting the upper layer, and the second movable layer 27, the second frame layer 29, the second fixed layer (not shown), and the second spring layer 44 constituting the lower layer. Therefore, the stopper portion 18v10 also has a three-layer structure of the first frame layer 28, the third frame layer 51, and the second frame layer 29.

Further, the intermediate layer is made of a material different from that of the upper layer and the lower layer. For example, the intermediate substrate 19 is a Silicon On Insulator (SOI) substrate, the upper layer and the lower layer are made of silicon, and the intermediate layer is made of silicon oxide. The thickness 35 of the upper layer is, for example, about 60 μm, the thickness 36 of the lower layer is, for example, about 380 μm, and the thickness of the intermediate layer is, for example, about 1 μm to 2 μm.

According to the tenth modification example, since the intermediate layer functions as an etching stopper layer when the upper layer and the lower layer are formed by an etching process, there is an advantage that the thickness 35 of the upper layer and the thickness 36 of the lower layer can be more precisely controlled.

For example, in a case of a two-layer structure including the upper layer and the lower layer which are made of the same material, when etching the upper layer, the etching process proceeds even if the processing depth of the upper layer exceeds the thickness 35 of the upper layer, so that there is a concern that the actual processing depth may be different from the design value of the thickness 35 of the upper layer. However, in a case of a three-layer structure in which an intermediate layer made of a different material is present between an upper layer and a lower layer which are made of the same material, since the etching speeds of the upper layer, the lower layer and the intermediate layer are different from each other, the etching process can be stopped substantially at the boundary between the upper layer and the intermediate layer, by selecting a combination of suitable materials of the upper layer, the lower layer, and the intermediate layer. Similar control is also valid in the etching process of the lower layer. Thus, there is an advantage that the upper layer and the lower layer can be processed with the thickness as designed.

Embodiment 2

The characteristics and effects of a configuration of an acceleration sensor according to Embodiment 2 will be described using FIG. 15 and FIG. 16. FIG. 15 is a plan view showing a structure of a sensor element of an acceleration sensor according to Embodiment 2. FIG. 16 is a cross-sectional view taken along line E-E of FIG. 15. In FIG. 15, a mass body and a part of a frame portion in the vicinity thereof are shown, and fixed electrodes provided on the upper substrate opposed to the mass body are indicated by broken lines.

A difference between the acceleration sensor S2 according to Embodiment 2 and the acceleration sensor S1 according to Embodiment 1 described above is the shape of the mass body 11. The mass body 11 has a movable portion 65 positioned in the +x direction when the x coordinate of the rotation axis 15 is set to 0. When a signal (acceleration) is applied to the acceleration sensor element 10B from the outside, the mass body 11 vibrates around the rotation axis 15 provided in the y direction, through the spring portion 14 supported by the fixed portion 13.

A first signal detection electrode 22 is disposed on a surface of the upper substrate 20 that faces the movable portion 65, and a first signal detecting capacitive element 24 is provided between the movable portion 65 and the first signal detection electrode 22. Further, the second signal detection electrode 23 is disposed on a surface of the lower substrate 21 that faces the movable portion 65, and a second signal detecting capacitive element 25 is formed between the movable portion 65 and the second signal detection electrode 23. At this time, it is desirable that the first signal detection electrode 22 formed on the substrate 20 and the second signal detection electrode 25 formed on the lower substrate 21 are disposed at the same position on the xy plane.

The first signal detecting capacitive element 24 and the second signal detecting capacitive element 25 are capacitive elements for detecting the application of acceleration in the z direction. That is, acceleration is detected by detecting the capacitance change of the first signal detecting capacitive element 24 and the capacitance change of the second signal detecting capacitive element 25, which occurs in a case where acceleration in the z direction is applied to the mass body 11. At this time, since the capacitance change of the first signal detecting capacitive element 24 and the capacitance change of the second signal detecting capacitive element 25 are opposite in phase, for a certain acceleration, differential detection becomes possible by applying detection voltages of opposite phases to the first signal detection electrode 22 and the second signal detection electrode 23. However, in principle, acceleration detection becomes possible if either one of the first signal detecting capacitive element 24 and the second signal detecting capacitive element 25 is present. Even with such a configuration, it goes without saying that there is no problem.

The acceleration sensor element 10B according to Embodiment 2 is a sensor that detects the acceleration in the z direction, and can suppress excessive displacement of the mass body 11 on the xy plane, for the acceleration in the xy plane direction, by disposing the stopper portion 18, similarly to the acceleration sensor element 10A according to Embodiment 1 described above. The other effects and modification examples are similar to those of the acceleration sensor element 10A according to Embodiment 1 described above.

In this way, even if the shapes of the mass bodies 11 and the arrangement relationship of the first signal detection electrode 22 and the second signal detection electrode 23 are different as described above, it is possible to obtain substantially the same effect as that of Embodiment 1 described above.

Embodiment 3

The characteristics and effects of a configuration of an acceleration sensor according to Embodiment 3 will be described using FIG. 17 and FIGS. 18(a) and 18(b). FIG. 17 is a plan view showing a structure of a sensor element of an acceleration sensor according to Embodiment 3. FIG. 18(a) is a cross-sectional view taken along line F-F of FIG. 17. FIG. 18(b) is a cross-sectional view taken along line G-G of FIG. 17. In FIG. 17, the mass body and a part of the frame portion around the mass body are shown.

A difference between the acceleration sensor S3 according to Embodiment 3 and the acceleration sensor S1 according to Embodiment 1 described above is a detection direction of the acceleration. When a signal (acceleration) is applied to the acceleration sensor element 10C from the outside, the mass body 11 vibrates in the x direction, through the spring portion 14 supported by the fixed portion 13.

For example, a comb-tooth shaped electrode 70 is formed in the mass body 11, and a first signal detection electrode 22 and a second signal detection electrode 23, facing the electrode 70, are disposed in the same plane (xy plane) as the mass body 11. Further, a first signal detecting capacitive element is formed between the electrode 70 and the first signal detection electrode 22, and a second signal detecting capacitive element is formed between the electrode 70 and the second signal detection electrode 23. At this time, in the comb tooth electrode pair formed by the electrode 70 and the first signal detection electrode 22, the first signal detection electrode 22 is disposed in the +x direction with respect to the electrode 70. On the other hand, in the comb tooth electrode pair formed by the electrode 70 and the second signal detection electrode 23, the second signal detection electrode 23 is disposed in the −x direction with respect to the electrode 70.

The first signal detecting capacitive element and the second signal detecting capacitive element are capacitive elements for detecting the application of acceleration in the x direction. That is, acceleration is detected by detecting the capacitance change of the first signal detecting capacitive element and the capacitance change of the second signal detecting capacitive element, which occurs in a case where acceleration in the x direction is applied to the mass body 11. At this time, since the capacitance change of the first signal detecting capacitive element and the capacitance change of the second signal detecting capacitive element are opposite in phase, for a certain acceleration, differential detection becomes possible by applying detection voltages of opposite phases to the first signal detection electrode 22 and the second signal detection electrode 23. However, in principle, acceleration detection becomes possible if either one of the first signal detecting capacitive element and the second signal detecting capacitive element is present. Even with such a configuration, it goes without saying that there is no problem.

The acceleration sensor element 10C according to Embodiment 3 is a sensor that detects the acceleration in the x direction, and prevents excessive displacement on the xy plane of the mass body 11. For example, this is to prevent the spring portion 14 from being damaged due to excessive displacement of the mass body 11 on the xy plane, and to prevent the mass body 11 from being contact with the first signal detection electrode 22 and the second signal detection electrode 23 and shorted.

Thus, the acceleration sensor element 10C according to Embodiment 3 can suppress excessive displacement of the mass body 11 on the xy plane, for the acceleration in the xy plane direction, by disposing the stopper portion 18, similarly to the acceleration sensor element 10A according to Embodiment 1 described above. However, the shortest distance 31 between the mass body 11 and the stopper portion 18 is required to be shorter than the shortest distance 34 between the electrode 70 and the first signal detection electrode 22 or between the electrode 70 and the second signal detection electrode 23. The other effects and modification examples are similar to those of the acceleration sensor element 10A according to Embodiment 1 described above.

In this way, even if the direction of acceleration detection of the acceleration sensor element 10C is different, substantially the same effect as in Embodiment 1 can be obtained.

Hitherto, the invention made by the present inventors has been specifically described based on the embodiments, but the present invention is not limited to the embodiments, and various modification examples are possible within a scope without departing from the spirit. For example, the embodiments have been described in detail in order to explain the present invention in an easy-to-understand manner and are not necessarily limited to those having all the configurations described. Further, with respect to a part of the configuration of the embodiments, addition, deletion, and replacement of other configurations can be performed, and furthermore, each configuration example can be combined.

REFERENCE SIGNS LIST 10A, 10B, 10C ACCELERATION SENSOR ELEMENT
11 MASS BODY
12 FRAME PORTION
13 FIXED PORTION
14 SPRING PORTION
15 ROTATION AXIS
16 FIRST MOVABLE PORTION
17 SECOND MOVABLE PORTION
18, 18$v$1 to 19$v$10 STOPPER PORTION
19 INTERMEDIATE SUBSTRATE
20 UPPER SUBSTRATE
21 LOWER SUBSTRATE
22 FIRST SIGNAL DETECTION ELECTRODE
23 SECOND SIGNAL DETECTION ELECTRODE
24 FIRST SIGNAL DETECTING CAPACITIVE ELEMENT
25 SECOND SIGNAL DETECTING CAPACITIVE ELEMENT
26 FIRST MOVABLE LAYER
27 SECOND MOVABLE LAYER
28 FIRST FRAME LAYER
29 SECOND FRAME LAYER
30, 31, 32, 33, 34 DISTANCE
35, 36, 37 THICKNESS
38 FIRST FIXED LAYER
39 SECOND FIXED LAYER
40 ELASTIC PORTION
41 SLIT PORTION
42 PROTRUDING PORTION
43 FIRST SPRING LAYER
44 SECOND SPRING LAYER
45 THIRD FIXED LAYER
46 FOURTH FIXED LAYER
50 THIRD MOVABLE LAYER
51 THIRD FRAME LAYER
52 THIRD SPRING LAYER
60 FIXED POST
65 MOVABLE PORTION
70 ELECTRODE
S1, S2, S3 ACCELERATION SENSOR

The invention claimed is:
1. An acceleration sensor comprising:
a first substrate;
a second substrate spaced apart from the first substrate; and an intermediate substrate provided between the first substrate and the second substrate and formed of a single substrate including a first part on a first substrate side and a second part on a second substrate side, wherein a thickness of said first part of said intermediate substrate is different from a thickness of said second part of said intermediate substrate in a first direction, wherein the intermediate substrate includes
- a fixed portion fixed to the first substrate and the second substrate,
- a movable portion displaceable with respect to the fixed portion,
- a frame portion provided outside the movable portion while being spaced apart from the movable portion,
- an elastic portion provided at one end of the frame portion so as to face the movable portion, and
- a stopper portion disposed between the movable portion and the frame portion and comprising said elastic portion, wherein the fixed portion is configured with a first fixed layer including the first part and a second fixed layer including the second part, wherein the movable portion is configured with a first movable layer including the first part and a second movable layer including the second part, wherein the frame portion is configured with a first frame layer including the first part and a second frame layer including the second part, wherein the elastic portion is configured with a first elastic layer including the first part and a second elastic layer including the second part, wherein said intermediate substrate is constructed to have a first shortest distance between an end portion of the first elastic layer and an end portion of the first movable layer which face each other, and a second shortest distance, different from said first shortest distance, between an end portion of the second elastic layer and an end portion of the second movable layer which face each other, wherein said movable portion, said frame portion, said fixed portion, and said elastic portion are each formed by a two or more-layer structure comprising the first part and the second part and are each constructed and arranged to provide said first and second shortest distances between the movable portion and the stopper portion to allow a thickness of said intermediate substrate in said first direction to be unrestricted, wherein a plurality of said stopper portions are disposed within said frame portion in a plan view and are arranged to prevent excessive displacement of said movable portion in X and Y directions of an XY plane orthogonal to said first direction, and such that said first and second shortest distances are selected to suppress an impact force received by each said stopper portion when the movable portion moves in said X and Y directions and collides with the stopper portion, and wherein said intermediate substrate is constructed such that each said first and second shortest distance is the same for each respective stopper portion of said plurality of stopper portions, by providing each said first and second shortest distance to be a same distance within the respective first and second parts of said first and second elastic layers and first and second movable layers with respect to said X and Y directions in which said end portions face each other, and such that said end portions which face each other are parallel with respect to said first direction.

2. The acceleration sensor according to claim 1,
wherein a thickness of the first elastic layer is thinner than a thickness of the second elastic layer in said first direction, and
wherein the first shortest distance is shorter than the second shortest distance.

3. The acceleration sensor according to claim 1,
wherein at a position where the elastic portion and the movable portion face each other,
the end portion of the first elastic layer rather than the end portion of the second elastic layer protrudes toward the movable portion side, and
the end portion of the first movable layer rather than the end portion of the second movable layer protrudes toward the elastic portion side.

4. The acceleration sensor according to claim 1,
wherein the first part and the second part are made of a same material.

5. The acceleration sensor according to claim 1,
wherein a third part is formed between the first part and the second part, and a material of the third part is different from a material of the first part and the second part.

6. The acceleration sensor according to claim 5,
wherein the material of the first part and the second part is silicon, and the material of the third part is silicon oxide.

7. The acceleration sensor according to claim 1,
wherein the elastic portion has a both-end fixed beam structure or a cantilevered beam structure.

8. An acceleration sensor comprising:
a first substrate;
a second substrate spaced apart from the first substrate; and
an intermediate substrate provided between the first substrate and the second substrate and formed of a single substrate including a first part on a first substrate side and a second part on a second substrate side, wherein a thickness of said first part of said intermediate substrate is different from a thickness of said second part of said intermediate substrate in a first direction, wherein the intermediate substrate includes
- a fixed portion fixed to the first substrate and the second substrate,
- a movable portion displaceable with respect to the fixed portion,
- a frame portion provided outside the movable portion while being spaced apart from the movable portion,
- an elastic portion provided at one end of the frame portion so as to face the movable portion, and
- a stopper portion disposed between the movable portion and the frame portion and comprising said elastic portion, wherein the fixed portion is configured with a first fixed layer including the first part and a second fixed layer including the second part, wherein the movable portion is configured with a first movable layer including the first part and a second movable layer including the second part, wherein the frame portion is configured with a first frame layer including the first part and a second frame layer including the second part, wherein the elastic portion is configured with a first elastic layer including the first part and a second elastic layer including the second part, wherein said intermediate substrate is constructed to have a first shortest distance between an end portion of the first elastic layer and an end portion of the first movable layer which face each other, and a second shortest distance, different from said first shortest distance, between an end portion of the second elastic layer and an end portion of the second movable layer which face each other, wherein said movable portion, said frame portion, said fixed portion, and said elastic portion are each formed by a two or more-layer structure comprising the first part and the second part and are each constructed and arranged to provide said first and second shortest distances between the movable portion and the stopper portion to allow a thickness of said intermediate substrate in said first direction to be unrestricted, wherein a plurality of said stopper portions are formed on said first and second movable layers and are arranged to prevent excessive displacement of said movable portion in X and Y directions of an XY plane orthogonal to said first direction, and such that said first and second shortest distances are selected to suppress an impact force received by each said stopper portion when the movable portion moves in said X and Y directions and collides with the stopper portion, and wherein said intermediate substrate is constructed such that each said first and second shortest distance is the same for each respective stopper portion of said plurality of stopper portions, by providing each said first and second shortest distance to be a same distance within the respective first and second parts of said first and second elastic layers and first and second movable layers with respect to said X and Y directions in which said end portions face each other, and such that said end portions which face each other are parallel with respect to said first direction.

9. The acceleration sensor according to claim 8, wherein a thickness of the first elastic layer is thinner than a thickness of the second elastic layer in said first direction, and wherein the first shortest distance is shorter than the second shortest distance.

10. The acceleration sensor according to claim 8, wherein the first part and the second part are made of a same material.

11. The acceleration sensor according to claim 8, wherein a third part is formed between the first part and the second part, and a material of the third part is different from a material of the first part and the second part.

12. The acceleration sensor according to claim 11, wherein the material of the first part and the second part is silicon, and the material of the third part is silicon oxide.

13. The acceleration sensor according to claim 8, wherein the elastic portion has a both-end fixed beam structure or a cantilevered beam structure.

\* \* \* \* \*